United States Patent [19]
Iwasa et al.

[11] Patent Number: 5,994,025
[45] Date of Patent: *Nov. 30, 1999

[54] PHOTORESIST, COMPOUNDS FOR COMPOSING THE PHOTORESIST, AND METHOD OF FORMING PATTERN BY USING THE PHOTORESIST

[75] Inventors: Shigeyuki Iwasa; Kaichiro Nakano; Katsumi Maeda; Takeshi Ohfuji; Etsuo Hasegawa, all of Tokyo, Japan

[73] Assignee: NEC Corporation, Tokyo, Japan

[*] Notice: This patent is subject to a terminal disclaimer.

[21] Appl. No.: 08/763,054

[22] Filed: Dec. 10, 1996

[30] Foreign Application Priority Data

Dec. 11, 1995 [JP] Japan .................................. 7-322039
Nov. 20, 1996 [JP] Japan .................................. 8-309742

[51] Int. Cl.$^6$ .................................................. G03F 7/004
[52] U.S. Cl. ...................... 430/270.1; 430/909; 430/910
[58] Field of Search .............................. 430/270.1, 909, 430/910

[56] References Cited

U.S. PATENT DOCUMENTS

| | | | |
|---|---|---|---|
| 5,212,043 | 5/1993 | Yamamoto et al. | 430/910 |
| 5,332,650 | 7/1994 | Murata et al. | 430/950 |
| 5,399,647 | 3/1995 | Nozaki | 430/270.1 |
| 5,587,274 | 12/1996 | Kishida et al. | 430/270.1 |
| 5,635,332 | 6/1997 | Nakano et al. | 430/270.1 |
| 5,665,518 | 9/1997 | Maeda et al. | 430/270.1 |
| 5,688,628 | 11/1997 | Oie et al. | 430/270.1 |
| 5,738,975 | 4/1998 | Nakano et al. | 430/270.1 |

FOREIGN PATENT DOCUMENTS

| | | |
|---|---|---|
| 227660 | 6/1990 | Japan . |
| 5134416 | 5/1993 | Japan . |

OTHER PUBLICATIONS

Resist Materials for Short Wavelenght, 1988, pp. 16–21.
H. Ito et al.; "Applications of Photoinitiators to the Design of Resists for Semiconductor Manufacturing"; Polymers in Microelectronics, American Chemical Society Symposium Series, 1984, vol. 242, pp. 11–23.
S. Takechi et al.; "Alicyclic Polymer for ArF and KrF Excimer Resist Based on Chemical Amplification"; Journal of Photopolymer Science and Technology, vol. 5, No. 3, 1992, pp. 439–446.
K. Nakano et al.; "Positive Chemically Amplified Resist for ArF Excimer Laser Lithography . . . Terpolymer"; SPIE, vol. 2438, 1995, pp. 433–444.
R.D. Allen et al.; "Single Layer Resists with Enhanced Etch Resistance for 193 nm Lithography"; Journal of Photopolymer Science and Technology, vol. 7, No. 3, 1994, pp. 507–516.
T. Sakamizu et al.; "Acid–Catalyzed Reactions of Tetrahydropyranyl–Protected Polyvinylphenol in a Novolak–Resin–Based Positive Resist"; Jpn. J. Appl. Phys., vol. 31 (1992) pp. 4288–4293.
S.A. MacDonald et al.; "Airborne Chemical Contamination of a Chemically Amplified Resist"; SPIE, vol. 1466 (1991), pp. 2–12.

J.V. Crivello et al.; "A New Preparation of Triarylsulfonium and –selenonium Salts via the . . . Salts"; Journal of Organic Chemistry, vol. 43, No. 15, 1978, pp. 3055–3058.
T.X. Neenan et al.; "Chemically Amplified Resists: A Lithographic Comparison of Acid Generating Species"; SPIE, vol. 1086 (1989), pp. 2–10.
T. Ueno et al.; "Chemical Amplification Positive Resist Systems Using Novel Sulfonates as Acid Generators"; Proceedings of PME'89, 1990, pp. 413–424.
G.N. Taylor et al.; "Positive, Chemically Amplified Aromatic Methacrylate Resist . . . Group"; Chem. Mater. 1991, vol. 3, pp. 1031–1040.

*Primary Examiner*—John S. Chu
*Attorney, Agent, or Firm*—Whitham, Curtis & Whitham

[57] ABSTRACT

There is provided a photoresist including (a) a resin composed of a polymer represented with the following general formula [1], and (b) a photo acid generator which produces acid when exposed to a light:

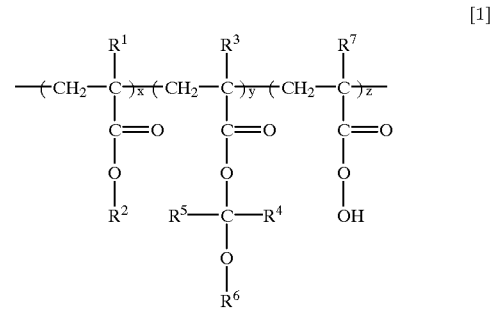

[1]

wherein each of $R^1$, $R^3$ and $R^7$ represents one of a hydrogen atom and a methyl group, $R^2$ represents a hydrocarbon group including a bridged cyclic hydrocarbon group and having a carbon number in the range of 7 to 13 both inclusive, $R^4$ represents one of a hydrogen atom and a hydrocarbon group having a carbon number of 1 or 2, $R^5$ represents a hydrocarbon group having a carbon number of 1 or 2, $R^6$ represents one of (a) a hydrocarbon group having a carbon number in the range of 1 to 12 both inclusive, (b) a hydrocarbon group having a carbon number in the range of 1 to 12 both inclusive and replaced with an alkoxy group having a carbon number in the range of 1 to 12 both inclusive, and (c) a hydrocarbon group having a carbon number in the range of 1 to 12 both inclusive and replaced with an acyl group having a carbon number in the range of 1 to 13 both inclusive, x+y+z=1, x is in the range of 0.1 to 0.9, y is in the range of 0.1 to 0.7, and z is in the range of 0 to 0.7. The resin has a weight percent in the range of 75 to 99.8 both inclusive, and the photo acid generator has a weight percent in the range of 0.2 to 25 both inclusive. The above mentioned photoresist produces no extra polymer by side reaction. Thus, the photoresist has high resolution to thereby make it possible to form a fine pattern without resist residue.

6 Claims, 1 Drawing Sheet

PHOTORESIST, COMPOUNDS FOR COMPOSING THE PHOTORESIST, AND METHOD OF FORMING PATTERN BY USING THE PHOTORESIST

BACKGROUND OF THE INVENTION

1. Field of the Invention

The present invention relates to a photoresist and compounds of which the photoresist is made, and further relates to a method of forming a resist pattern by using the photoresist.

2. Description of the Related Art

In a field of manufacturing various electronic devices such as VLSI in which sub-micron order patterns are required to form, an electric device is now required to have higher densification and integration. Thus, an improved lithography technique for forming a more minute pattern on a substrate is required for satisfying such a requirement.

As one of methods for forming a more minute pattern is known a method in which an exposure light having a shorter wavelength is used for forming a resist pattern. For instance, there has been used i-line of high-pressure mercury vapor lamp, which has a wave length of 365 nm, as a light source for forming a dynamic random access memory (DRAM) having an integration of 64 M bits or less. In a mass production of a 0.25 μm-rule 256 M bits DRAM, it is now being expected that the i-line is replaced with KrF excimer laser, as an exposure light source, having a shorter wavelength than that of the i-line, more specifically, having a wavelength of 248 nm. However, the fabrication of 0.18 μm-rule 1 G bits or greater DRAM which requires a technique for forming a more fine patterns needs a light source having a shorter wavelength than that of KrF excimer laser to be developed. For that purpose, an ArF excimer laser having a wavelength of 193 nm now attracts attention as a light source to be used in photolithography. For instance, the utilization of ArF excimer laser is discussed by T. Ueno, T. Iwayanagi, K. Nono, H. Ito and C. Grant Willson: "Resist Materials for Short Wavelength" Bunshin Shuppan Inc., 1988.

Hence, there is now expected to develop a new resist to be employed for photolithography in which ArF excimer laser is to be used. Such a resist used for ArF light exposure is required to enhance cost performance of laser, because a gas from which laser is radiated has short life-time, and also because a laser radiating equipment is expensive. Thus, the resist is expected to have a high resolution as well as a high sensitivity in response to a design rule getting smaller and smaller.

As one of methods of enhancing a sensitivity of resist, there has been well known a chemically amplified resist which utilizes a photo acid generator as a sensitizer. For typical instance, Japanese Patent Publication No. 2-27660 has suggested a resist comprised of a combination of triphenylsulfonium hexafluoroarsenate and poly (p-tert-butoxycarbonyloxy-α-methylstyrene). There are many reports about a chemically amplified resist for use with a KrF excimer laser, for instance, one of which is American Chemical Society Symposium Series, 1984, Vol. 242, pages 11–23, reported by Hiroshi Ito and C. Grant Willson. A chemically amplified resist is characterized by the steps of generating proton acid by exposing a photo acid generator to a light, and transferring the thus generated proton acid through a resist solid phase by means of post-exposure heat treatment to thereby amplify chemical reaction of the resist resin up to hundreds of to thousands of times due to the proton acid in a way like catalytic action. Thus, a quite higher sensitivity can be attained relative to a prior resist which has an optical reaction efficiency, which is defined as a reaction per a photon, of smaller than one (1).

Presently, most of newly developed resists are chemically amplified resists, and hence a chemical amplification system has to be adopted in development of a high sensitive material in response to a wavelength of an exposure light source getting smaller and smaller.

In a conventional lithography in which there is employed an exposure light having a longer wavelength than that of KrF excimer laser having a wavelength of 248 nm, a photoresist contains a resin having aromatic rings in a structural unit, such as novolac resin and poly (p-vinylphenol). The dry etching resistance of such aromatic rings gives a dry etching resistance to the above mentioned resin.

However, the aromatic rings quite intensively absorb lights having a wavelength equal to or shorter than 220 nm such as ArF excimer laser having a wavelength of 193 nm, and hence the above mentioned conventional resins cannot be applied to a photolithography in which there is used a light source emitting deep ultraviolet radiation (DUV) having a wavelength equal to or shorter than 220 nm. Thus, there is now studied a resin which does not contain aromatic rings, but has etching resistance, and which contains alicyclic hydrocarbon. For instance, such a resin has been reported by S. Takechi, Journal of Photopolymer Science and Technology, Vol. 5, No. 3, 1992, pp. 439–446.

However, since alicyclic groups have strong hydrophobic property, the introduction of alicyclic groups causes a resin containing the alicyclic groups to have stronger hydrophobic property, which would cause problems that adhesion of a formed thin film to a silicon substrate is deteriorated, and that the uniformity of a thickness of a film to be formed on a substrate is also deteriorated.

As one of solutions to the problems, there has been suggested the use of methacrylic acid unit. For instance, the inventors have already suggested the copolymer in "Positive Chemically Amplified Resist for ArF Excimer Laser Lithography Composed of a Novel Transparent Photoacid Generator and an Alicyclic Terpolymer", Proceeding of SPIE, Vol. 2438, 1995, pp. 433–444. The copolymer consists of tricyclodecanylacrylate, tetrahydropyranylmethacrylate and methacrylic acid, and is a resin used for a resist into which alicyclic groups and methacrylic acid units are introduced.

Thus, a polymer having transparency to a light having a wavelength of 193 nm and also having a dry-etching resistance can be attained by introduction of alicyclic polymers, and the above mentioned problems of deterioration in adhesion and film thickness uniformity which would be caused by the introduction of alicyclic polymers can be overcome by introduction of methacrylic acid units. The above mentioned resin for composing a resist generally includes tetrahydropyranyl groups and tert-butyl groups as a protective group which is decomposed by acid and changes a polarity of a polymer. For instance, the use of a tetrahydropyranyl group has been reported in K. Nakano, K. Maeda, S. Iwasa, T. Ohfuji and E. Hasegawa: "Positive Chemically Amplified Resist for ArF Excimer Laser Lithography Composed of a Novel Transparent Photoacid Generator and an Alicyclic Terpolymer", Proceeding of SPIE, Vol. 2438, pp.433–444, and the use of a tert-butyl group has been reported in R. D. Allen, G. M. Wallraff, R. A. Dipietro, D. C. Hofer and R. R. Kunz: "Single Layer Resists with Enhanced Etch Resistance for 193 nm Lithography", Journal of Photopolymer Science and Technology, Vol. 7, No. 3, 1994, pp. 507–516.

However, a tetrahydropyranyl group has shortcomings of a low thermal decomposition point and low thermal stability. In addition, it is known that a tetrahydropyranyl group produces a polymer as a result of side reaction, when used as a protective group for polyvinylphenol, as reported in T. Sakamizu, H. Shiraishi, H. Yamaguchi, T. Ueno and N. Hayashi: "Acid-Catalyzed Reactions of Tetrahydropyranyl-Protected Polyvinylphenol in a Novolak-Resin-Based Positive Resist", Japanese Journal Application Physics, Vol. 31, 1992, pp. 4288–4293.

Similarly, when a tetrahydropyranyl group is used as a protective group for methacrylic acid, there will be formed a polymer as a result of side reaction in a way as shown in the following chemical reaction formula [5]. Namely, a tetrahydropyranyl group has faults as a protective group that it will produce a polymer as a by-product which prevents the resist from being dissolved to a developing agent to thereby deteriorate resolution of the resist, and further thereby produce resist residue or scum.

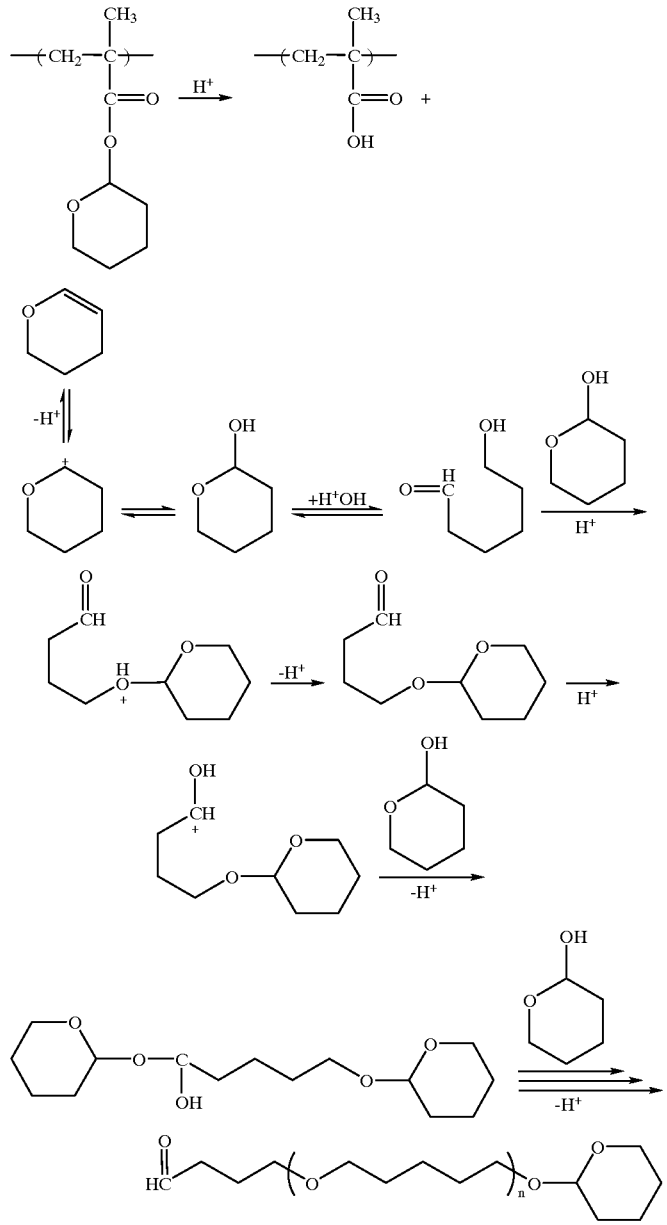

[5]

On the other hand, a tert-butyl group does not proceed desorption quantitatively unless a strong acid such as triphlate acid is used. Hence, a photo acid generator to be used in the photoresist is limited to one which would produce triphlate acid, such as triphenylsulfoniumtrifluoromethanesulfonate. However, triphlate acid has high volatility, and tends to be evapotraspired from a resist film before a resist is developed. In addition, as triphlate acid is a strong acid, it readily reacts with basic compounds existing in the air. Thus, there tends to be produced a so-called surface dissolution resisting layer on which, when triphlate acid is used, triphlate acid is deactivated and thus cannot reach an effective amount at a part of a surface of a resist film, and hence a pattern on the part cannot resolved. As a result, the resolution of a resist is remarkably deteriorated. The study about this phenomenon is provided by S. A. MacDonald et al., Proceedings of SPIE, 1991, Vol. 1446, pp. 2–12.

As discussed above, a resist for lithography employing a light having a wavelength equal to or smaller than 220 nm has the etching resistance and adhesion to a substrate, but does not have protective groups for changing polarity of a resin. Thus, there has been suggested no resists having high resolution and high sensitivity by which a fine pattern can be obtained without production of scum.

SUMMARY OF THE INVENTION

In view of the shortcomings of prior photoresists, it is an object of the present invention to provide a photoresist to be used in lithography in which there is employed a light source emitting far ultraviolet radiation having a wavelength equal to or smaller than 220 nm, such as ArF excimer laser, which photoresist provides high resolution and high thermal stability.

It is also an object of the present invention to provide a polymer of which the above mentioned photoresist is made.

It is another object of the present invention to provide a method of patterning a photoresist, which method makes it possible to form a fine resist pattern.

The inventors have studied a protective group which has higher thermal stability than a tetrahydropyranyl group, which is not accompanied with side reaction, and which is decomposable in acid. As a result of the long term study, the inventors could reach the inventions mentioned hereinbelow by which all of the above mentioned problems can be overcome.

In one aspect, there is provided a polymer represented with the following general formula [1]:

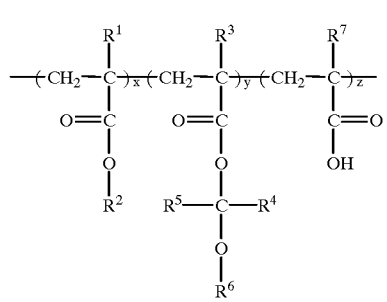

[1]

wherein each of $R^1$, $R^3$ and $R^7$ represents one of a hydrogen atom and a ethyl group, $R^2$ represents a hydrocarbon group including a bridged cyclic hydrocarbon group and having a carbon number in the range of 7 to 13 both inclusive, $R^4$ represents one of a hydrogen atom and a hydrocarbon group having a carbon number of 1 or 2, $R^5$ represents a hydrocarbon group having a carbon number of 1 or 2, $R^6$ represents one of (a) a hydrocarbon group having a carbon number in the range of 1 to 12 both inclusive, (b) a hydrocarbon group having a carbon number in the range of 1 to 12 both inclusive and replaced with an alkoxy group having a carbon number in the range of 1 to 12 both inclusive, and (c) a hydrocarbon group having a carbon number in the range of 1 to 12 both inclusive and replaced with an acyl group having a carbon number in the range of 1 to 13 both inclusive, $x+y+z=1$, x is in the range of 0.1 to 0.9, y is in the range of 0.1 to 0.7, and z is in the range of 0 to 0.7.

It is preferable that the above mentioned polymer has a weight average molecular weight in the range of 1,000 to 1,000,000 both inclusive.

In another aspect, there is provided a photoresist including (a) a resin composed of a polymer represented with the above mentioned general formula [1], and (b) a photo acid generator which produces acid when exposed to a light. The resin has a weight percent in the range of 75 to 99.8 both inclusive, and the photo acid generator has a weight percent in the range of 0.2 to 25 both inclusive.

The hydrocarbon group represented with $R^2$ includes, for instance, a tricyclo [$5.2.1.0^{2,6}$] decyl group, a tetracyclo [$4.4.0.1^{2,5}.1^{7,10}$] dodecyl group, a dicyclopentenyl group, a dicyclopentenyloxyethyl group, a norbonyl group and an adamantyl group. However, the divalent hydrocarbon group $R^2$ is not to be limited to those listed above.

Each of the hydrocarbon groups represented with $R^4$ and $R^5$ is, for instance, a methyl group or an ethyl group.

The hydrocarbon group represented with $R^6$ includes, for instance, a methyl group, an ethyl group, a propyl group, a butyl group, a pentyl group, a hexyl group, a heptyl group, an octyl group, a nonyl group, a decyl group, an undecyl group, a dodecyl group, a cyclopentyl group, a cyclohexyl group, a cycloheptyl group, a norbornyl group, a tricyclodecyl group, a dicyclopentenyl group, a cyclohexyl group, a norbonyl group, an adamantyl group, a methoxyethyl group, an ethoxyethyl group, a propoxyethyl group, a butoxyethyl group, a pentyloxyethyl group, a hexyloxyethyl group, a heptyloxyethyl group, a cycloheptyloxyethyl group, a cyclohexyloxyethyl group, a cyclopentyloxyethyl group, a cyclohexyloxyethyl group, a cyclooctyloxyethyl group, a norbornyloxyethyl group, an adamantyloxyethyl group, a methoxypropyl group, an ethoxypropyl group, a propoxypropyl group, an acetoxyethyl group, and an adamantylcarbonyloxyethyl group. However, the hydrocarbon group $R^6$ is not to be limited to those listed above.

The above mentioned polymer in accordance with the present invention can overcome the earlier discussed problems. In a resin containing the polymer defined by the general formula [1], a part represented with the following general formula [2] is easily decomposed by acid to thereby change polarity of the polymer. The part represented with the general formula [2] is decomposed by heated acid into carboxylic acid, alcohol and aldehyde.

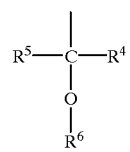

[2]

In the general formula [2], each of the hydrocarbon groups represented with $R^4$ and $R^5$ is, for instance, a methyl group or an ethyl group, and $R^6$ represents one of (a) a hydrocarbon group having a carbon number in the range of 1 to 12 both inclusive, (b) a hydrocarbon group having a carbon number in the range of 1 to 12 both inclusive and replaced with an alkoxy group having a carbon number in the range of 1 to 12 both inclusive, and (c) a hydrocarbon group having a carbon number in the range of 1 to 12 both inclusive and replaced with an acyl group having a carbon number in the range of 1 to 13 both inclusive.

The hydrocarbon group represented with $R^6$ includes, for instance, a methyl group, an ethyl group, a propyl group, a butyl group, a pentyl group, a hexyl group, a heptyl group, an octyl group, a nonyl group, a decyl group, an undecyl group, a dodecyl group, a cyclopentyl group, a cyclohexyl group, a cycloheptyl group, a norbornyl group, a tricyclodecanyl group, a dicyclopentenyl group, a cyclohexyl group, a norbonyl group, an adamantyl group, a methoxyethyl group, an ethoxyethyl group, a propoxyethyl group, a butoxyethyl group, a pentyloxyethyl group, a hexyloxyethyl group, a heptyloxyethyl group, a cycloheptyloxyethyl group, a cyclohexyloxyethyl group, a cyclopentyloxyethyl group, a cyclohexyloxyethyl group, a cyclooctyloxyethyl group, a norbornyloxyethyl group, an adamantyloxyethyl group, a methoxypropyl group, an ethoxypropyl group, a propoxypropyl group, an acetoxyethyl group, and an adamantylcarbonyloxyethyl group. However, the hydrocarbon group $R^6$ is not to be limited to those listed above.

Since the part represented with the general formula [2] has alkoxy groups which are one of electron donating groups, and have small steric hindrance to acid, acid is readily accessible to the part. Thus, decomposition proceeds more rapidly than conventionally used tetrahydropyranyl group and tert-butyl group. Accordingly, a photoresist made of the polymers in accordance with the present invention makes it possible to carry out resolution with smaller amount of light for exposure than a conventional resin to be used for ArF excimer laser lithography employing a tert-butyl group or a tetrahydropyranyl group.

A tert-butyl group has low desorption reaction efficiency, and hence could not carry out resolution unless there is used a photo acid generator which produces strong acid such as triphlate acid. However, if a photo acid generator which will produce strong acid such as triphlate acid is employed, a photoresist tends to be influenced by the effect of unlikeliness of dissolution of a surface thereof, and hence it is difficult to form a fine pattern. Thus, a surface protection film needs to be formed over a resist.

On the other hand, the photoresist made in accordance with the present invention makes it possible to carry out resolution, even if there is employed a photo acid generator which produces weaker acid than triphlate acid, such as toluenesulfonic acid. In addition, the photoresist made in accordance with the present invention produces no any polymers as by-products unlike a conventional resin employing a tetrahydropyranyl group therein. Thus, the present invention makes it possible to form a fine resist pattern without resist residue or scum.

In still another aspect, there is provided a method of patterning a photoresist, including the steps of (a) applying a photoresist on a substrate, (b) exposing the photoresist to a light having a wavelength smaller than 400 nanometers, and (c) developing the photoresist to thereby form a resist pattern. Herein, the photoresist includes (a) a resin composed of a polymer represented with the above mentioned general formula [1], and (b) a photo acid generator which produces acid when exposed to a light. The resin has a weight percent in the range of 75 to 99.8 both inclusive, and the photo acid generator has a weight percent in the range of 0.2 to 25 both inclusive.

It is preferable that the light has a wavelength in the range of 180 nanometers to 220 nanometers. It is also preferable that there is employed ArF excimer laser as the light.

It is preferable that the photo acid generator as a constituent of the photoresist made in accordance with the present invention is one that generates an acid when exposed to a light which preferably has a wavelength equal to or less than 400 nm, more preferably in the range of 180 to 220 nm both inclusive. Any photo acid generator may be used for the present invention, if a mixture of the earlier mentioned polymer made in accordance with the invention and the photo acid generator is sufficiently soluble in an organic solvent, and further if it is possible to form a uniform deposition film from the solution by means of a layer forming process such as a spin coating process. One or more photo acid generators may be mixed for use with the invention. As an alternative, the photo acid generator may be used in combination with appropriate photosensitizer(s).

Photo acid generators usable for reducing the present invention into practice may be selected, for instance, from any one of (a) triphenylsulfonium salt derivatives proposed in Journal of the Organic Chemistry, 1978, Vol. 43, No. 15, pp. 3055–3058, by J. V. Crivello et al., (b) onium salts such as sulfonium salt, iodonium salt, phosphonium salt, diazonium salt and ammonium salt, (c) 2,6-dinitrobenzyl ester proposed in Proceedings of SPIE, 1989, Vol. 1086, pp. 2–10, by T. Neenan et al., (d), 1, 2, 3-tri (methanesulfonyloxy) benzene proposed in Proceedings of PME '89, 1990, pp 413–424, by Takumi Ueno et al., published through Kodansha, (e) sulfosuccinimide disclosed in Japanese Unexamined Patent Publication No. 5-134416. However, it should be noted that a photo acid generator to be used for the present invention is not to be limited to the above mentioned ones (a) to (e).

The most preferable photo acid generators are ones represented with the following general formulas [3] and [4].

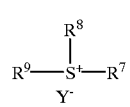

[3]

In the formula [3], each of $R^7$ and $R^8$ represents one of straight-chain, branch-type and cyclic alkyl groups, and $R^9$ represents one of (a) a straight-chain, branch-type or cyclic alkyl group, (b) a 2-oxo cyclic alkyl group, (c) a 2-oxo straight-chain alkyl group, and (d) a 2-oxo branch-type alkyl group, and $Y^-$ is a negative ion in the pair shown and may represent negative ions such as $BF_4{-}$, $AsF_6{-}$, $SbF_6{-}$, $PF_6{-}$, $CF_3COO{-}$, $ClO_4{-}$, and $CF_3SO_3{-}$.

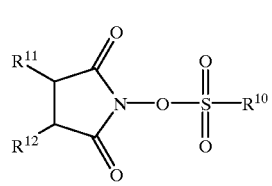

[4]

In the formula [4], $R^{10}$ represents one of (a) a straight-chain, branch-type or cyclic alkyl group, (b) a replaced aromatic ring, and (c) a non-replaced aromatic ring, and each of $R^{11}$ and $R^{12}$ represents one of (a) a straight-chain, branch-type or cyclic alkyl group and (b) a straight-chain, branch-type or cyclic haloalkyl group.

A photo acid generator presently, widely used for KrF excimer laser lithography, such as triphenylsulfonium trifluoromethanesulfonate (hereinafter, referred to simply as "TPS"), has a quite strong light-absorbing property for deep ultraviolet radiation (DUV) having a wavelength equal to or smaller than 220 nm, and hence it is required to limit an amount thereof, if it is to be used as a photo acid generator in the present invention. Now comparing a transmissivity at a wavelength of 193.4 nm which is a main wavelength of ArF excimer laser beam, a transmissivity of a deposition film having a thickness of 1 μm and composed of polymethylmethacrylate containing TPS at 1.5 wt % on the basis of a total weight of the film was about 50%, and a transmissivity of a film having a thickness of 1 μm and composed of polymethylmethacrylate containing TPS at 5. 5 wt % was about 6%. On the other hand, a transmissivity of a polymethylmethacrylate deposition film containing therein, for instance, cyclohexylmethyl(2-oxocyclohexyl)sulfoniumtrifluoromethanesulfonate, which is one of sulfonium salt derivatives represented with the general formula [3], was 71% when the film contained the above mentioned compound at 5 wt %, and was 55% at 30 wt %, both of which are higher than the formerly mentioned transmissivity. A transmissivity of a deposition film containing therein, for instance, N-hydroxysuccinimidetrifluoromethanesulfonate, which is one of photo acid generators represented with the general formula [4], was about 50%, when the film contained the above mentioned compound at 5 wt %.

As discussed above, any of the photo acid generators represented with the general formulas [3] and [4] absorbs quite little amount of light in the band of DUV having a wavelength ranging from 180 nm to 220 nm, and accordingly it is obvious that they are preferable for a constituent of a resist to be used for ArF excimer laser lithography in terms of transparency to an exposure light. Specifically, a photo acid generator to be used for the photoresist made in accordance with the present invention may be selected from any one of (a) 2-oxocyclohexylmethyl(2-norbornyl)sulfoniumtrifluoromethanesulfonate, (b) cyclohexylmethyl(2-oxocyclohexyl)sulfoniumtrifluoromethanesulfonate, (c) dicyclohexyl(2-oxocyclohexyl)sulfoniumtrifluoromethanesufonate, (d) dicyclohexylsulfonylcyclohexanone, (e) dimethyl(2-oxocyclohexyl)sulfoniumtrifluoromethanesulfonate, (f) triphenylsulfoniumtrifluoromethanesulfonate, (g) diphenyliodoniumtrifluoromethanesulfonate, and (h) N-hydroxysuccinimidetrifluoromethanesulfonate.

However, it should be noted that a photo acid generator to be used for the present invention is not to be limited to those, and any other photo acid generator may be selected.

A single kind of or a plurality of kinds of photo acid generator(s) may be used in the photoresist made in accordance with the present invention. The photo acid generator is contained by weight percent preferably in the range from 0.2 to 25 both inclusive, and more preferably in the range from 0.5 to 15 both inclusive, provided that all constituents containing the photo acid generator constitute 100 wt %. If a content rate of the photo acid generator would be lower than 0.2 wt %, the photoresist could have only quite a small sensitivity, and hence the formation of a pattern would become difficult. On the other hand, if a content rate of the photo acid generator would be higher than 25 wt %, it would be difficult to form a uniform deposition layer, and further there would arise a problem that scum tends to be generated after development of a pattern. A content rate of the polymer is preferably in the range from 75 to 99.8 wt %, and more preferably in the range from 85 to 99.5 wt % on the basis of the 100 wt % of all constituents including the polymer itself.

Any organic solvent may be used for the photoresist made in accordance with the present invention, if the polymer and photo acid generator would be sufficiently soluble in a solvent, and further if it would be possible to form a uniform deposition layer from the solution by means of a method such as a spin coating process. A single kind of solvent or a plurality of kinds of solvents in combination may be used.

Specifically, a solvent to be used for the photoresist made in accordance with the present invention is selected from any one of n-propyl alcohol, isopropyl alcohol, n-butyl alcohol, tert-butyl alcohol, methylcellosolve acetate, ethylcellosolve acetate, propyleneglycol monoethylether acetate, methyl lactate, ethyl lactate, 2-methoxybutyl acetate, 2-ethoxyethyl acetate, pyrubic acid methyl, pyrubic acid ethyl, 3-methoxypropionatemethyl, 3-methoxypropionateethyl, N-methyl-2-pyrrolidinone, cyclohexanone, cyclopentanone, cyclohexanol, methylethylketone, 1,4-dioxan, ethyleneglycolmonomethylether, ethyleneglycolmonomethylether acetate, ethyleneglycolmonoethylether, ethyleneglycolmonoisopropylether, diethyleneglycolmonomethylether, and diethyleneglycoldimethylether. It should be noted that a solvent to be used for the photoresist is not to be limited to the above mentioned ones, but other solvents may be selected.

As would be obvious to those skilled in the art, essential constituents of the photoresist to be made in accordance with the present invention are the above mentioned polymer, photo acid generator, and solvent. However, the photoresist may include other constituents such as agent for preventing dissolution, surfactant, pigment, stabilizer, reagent for enhancing application property, and dye.

As will be obvious in view of the later mentioned preferred embodiments, a resin of which the inventive photoresist is made is thermally, highly stable. In addition, the inventors conducted an experiment for resolution by using ArF excimer laser as an exposure light, and confirmed that the photoresist in accordance with the present invention made it possible to form a rectangular, fine pattern with high sensitivity without resist residue or scum.

That is, the photoresist made in accordance with the present invention is suitable for the formation of a fine pattern in lithography in which there is employed DUV having a wavelength in the range of 180 nm to 220 nm as an exposure light.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
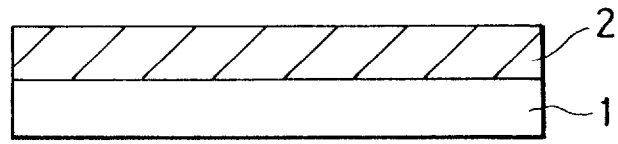
FIGS. 1, 2 and 3 are cross-sectional views of a wafer for showing steps of a method of forming a positive pattern on the wafer by using the photoresist made in accordance with the present invention.

Preferred embodiments in accordance with the present invention will be explained hereinbelow.

[SYNTHESIS EXAMPLE 1]

Synthesis of Ethoxyethyl Methacrylate represented with the formula [6]

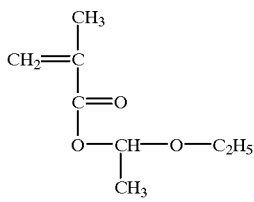

[6]

In a flask having four inlets, 15.1 grams (0.21 mols) of ethylvinylehter and 20 grams (0.23 mols) of methacrylic acid were dissolved into 200 ml of methylene chloride. Then, 0.53 grams (0.0021 mols) of p-toluenesulfonic acid pyridine salt was added to the mixture, and stirred for complete dissolution of p-toluenesulfonic acid pyridine salt into the mixture. The resultant solution was stood at room temperature for six hours. Then, 200 ml of diethylether was added into the solution. The resultant solution was washed three times with 2.5% aqueous sodium hydroxide, and further six times with water. Then, an ether layer was dehydrated with magnesium sulfate. After filtering magnesium sulfate out, a methylene chloride layer was evaporated. As a result, there was obtained 31.8 grams of 1-ethoxyethylmethacrylate. The yield was 96%. With respect to a structure of the target material, IR was measured with an analyzer, IR-470 model available from Shimazu Seisakusho, and $^1$H-NMR was measured with an analyzer, AMX-400 model available from Bruker Instruments.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.15–1.25 (t, 3 H), 1.4–1.5 (w, 3 H), 1.92–1.96 (s, 3 H), 3.4–3.8 (m, 2 H), 5.59–5.69 (w, 1 H), 5.98–6 (m, 1 H), 6.15–6.25 (w, 1 H)

[SYNTHESIS EXAMPLE 2]

Synthesis of 1-Butoxyethyl Methacrylate represented with the formula [7]

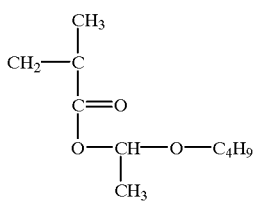

[7]

In the same way as the synthesis example 1, synthesis of monomer was performed using 21 grams (0.21 mols) of butylvinylether in place of ethylvinylether. As a result, there was obtained 36.6 grams of 1-butoxyethyl methacrylate. The yield was 94%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 0.75–1.85 (m, 10 H), 1.92–1.97 (s, 3 H), 3.42–3.8 (m, 2 H), 5.59–5.69 (w, 1 H), 6.00–6.05 (m, 1 H), 6.15–6.25 (w, 1 H)

[SYNTHESIS EXAMPLE 3]

Synthesis of Octyloxyethyl Methacrylate represented with the formula [8]

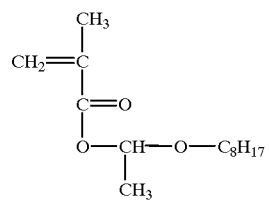

[8]

In the same way as the synthesis example 1, synthesis of monomer was performed using 32.8 grams (0.21 mols) of octylvinylether in place of ethylvinylether. As a result, there was obtained 46.2 grams of octyloxyethyl methacrylate. The yield was 91%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 0.75–1.85 (m, 18 H), 1.92–1.97 (s, 3 H), 3.42–3.8 (m, 2 H), 5.59–5.69 (w, 1 H), 6.00–6.05 (m, 1 H), 6.15–6.25 (w, 1 H)

[SYNTHESIS EXAMPLE 4]

Synthesis of Methoxypropyl Methacrylate represented with the formula [9]

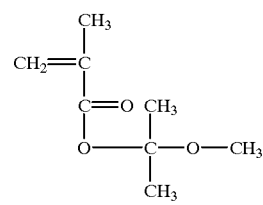

[9]

In the same way as the synthesis example 1, synthesis of monomer was performed using 15.1 grams (0.21 mols) of methylpropenylether in place of ethylvinylether. As a result, there was obtained 30.5 grams of methoxypropyl methacrylate. The yield was 92%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.41–1.5 (s, 6 H), 1.9–1.94 (s, 3 H), 3.47–3.53 (s, 3 H), 5.59–5.69 (w, 1 H), 6.15–6.25 (w, 1 H)

[SYNTHESIS EXAMPLE 5]

Synthesis of Methoxyethoxyethyl Methacrylate represented with the formula [10]

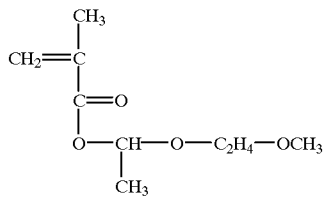

[10]

In the same way as the synthesis example 1, synthesis of monomer was performed using 21.42 grams (0.21 mols) of methoxyethylvinylether in place of ethylvinylether. As a result, there was obtained 36.3 grams of methoxyethoxyethyl methacrylate. The yield was 92%.

IR (liquid film method) (cm$^{-1}$): 2950, 2880 ($v_{C-H}$), 1720 ($v_{C=O}$), 1640 ($v_{C=O}$), 1170 ($v_{C-O}$)

$^1$H-NMR (CDCl$_3$, internal standard material: tetramethylsilane) ppm: 1.46–1.48 (m, 3 H), 1.945–1.95 (s, 3 H), 3.38–3.39 (s, 3 H), 3.65–3.9 (m, 4 H), 5.65–5.67 (w, 1 H), 6.02–6.07 (m, 1 H), 6.12–6.18 (w, 1 H)

[SYNTHESIS EXAMPLE 6]

Synthesis of Cyclohexyloxyethyl Methacrylate represented with the formula [11]

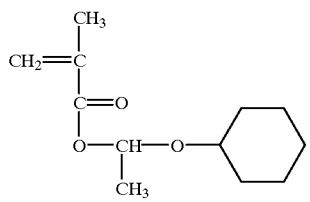

[11]

In the same way as the synthesis example 1, synthesis of monomer was performed using 26.5 grams (0.21 mols) of cyclohexylvinylether in place of ethylvinylether. As a result, there was obtained 42.3 grams of cyclohexyloxyethyl methacrylate. The yield was 95%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.41–1.5 (s, 13 H), 1.9–1.94 (s, 3 H), 3.47–3.53 (s, 1 H), 5.59–5.69 (w, 1 H), 6.02–6.07 (s, 1 H), 6.15–6.25 (w, 1 H)

[SYNTHESIS EXAMPLE 7]

Synthesis of Acetoxyethoxyethyl Methacrylate represented with the formula [12]

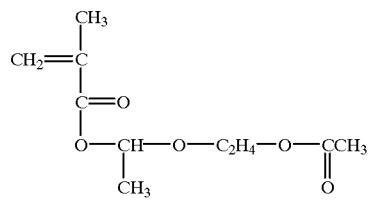

[12]

Followings were put into 500 ml flask having four inlets and equipped with a calcium chloride (CaCl$_2$) drying tube, an isotactic dropping funnel and a thermometer:

(a) 23.5 grams (0.3 mols) of 2-chloroethylvinylehter;

(b) 18.9 grams (0.23 mols) of sodium acetate anhydride; and (c) 0.5 grams (0.0014 mols) of tetrabutylammoniumchloride.

The mixture of (a) to (c) was refluxed with being stirred and heated for 12 hours. Then, the resultant mixture was cooled down to room temperature, and solid constituents were removed by filtering. Then, the resultant mixture was distilled under reduced pressure. As a result, there was obtained 26.6 grams of acetoxyethylvinylehter. The yield was 87%.

The thus obtained acetoxyethylvinylether by 19.5 grams (0.15 mols) and methacrylic acid by 15.5 grams (0.18 mols) were dissolved into methylene chloride. Then, 0.38 grams (0.0015 mols) of p-toluenesulfonic acid pyridine salt was added into the mixture, and stirred for complete dissolution. The resultant mixture is stood at room temperature for 6 hours. Then, the mixture was washed three times with 2.5% aqueous sodium hydroxide, and six times with water. Then, the resultant mixture was dehydrated with magnesium sulfate. After filtering magnesium sulfate out, solvent was removed by means of an evaporator. Then, the resultant residue was distilled under reduced pressure, thereby there was obtained 29.6 grams of acetoxyethoxyethylvinylether (b.p. 100–105° C./0.07 mmHg). The yield was 93%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.945–1.95 (s, 3 H), 2.06–1.08 (s, 3 H), 3.82–3.85 (t, 2 H), 4.2–4.28 (t, 2 H), 5.64–5.67 (s, 1 H), 6.02–6.07 (m, 1 H), 6.12–6.18 (s, 1 H)

[SYNTHESIS EXAMPLE 8]

Synthesis of Ethoxyethoxyethyl Methacrylate represented with the formula [13]

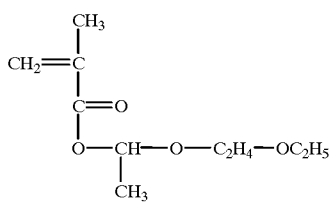

[13]

In the same way as the synthesis example 7, synthesis of monomer was performed using 15.6 grams (0.23 mols) of sodium ethanol salt in place of sodium acetate salt. As a result, there was obtained 26.4 grams of ethoxyethoxyethyl methacrylate. The yield was 88%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.1–1.3 (s, 3 H), 1.4–1.5 (s, 3 H), 1.945–1.95 (s, 3 H), 3.5–3.95 (t, 6 H), 5.64–5.67 (s, 1 H), 6.02–6.07 (m, 1 H), 6.12–6.18 (s, 1 H)

[SYNTHESIS EXAMPLE 9]

Synthesis of Buthoxyethoxyethyl Methacrylate represented with the formula [14]

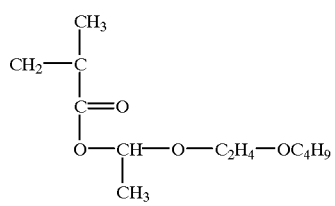

[14]

In the same way as the synthesis example 7, synthesis of monomer was performed using 40.3 grams (0.23 mols) of sodium buthanol salt in place of sodium acetate salt. As a result, there was obtained 41.7 grams of buthoxyethoxyethyl methacrylate. The yield was 90%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.05–2.2 (m, 21 H), 3.82–3.85 (t, 2 H), 4.2–4.28 (t, 2 H), 5.64–5.67 (s, 1 H), 6.02–6.07 (m, 1 H), 6.12–6.18 (s, 1 H)

[SYNTHESIS EXAMPLE 10]

Synthesis of Propylcarbonyloxyethoxyethyl Methacrylate represented with the formula [15]

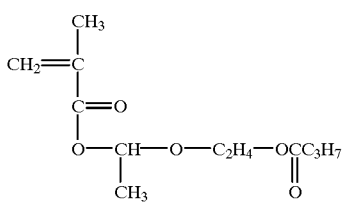

[15]

In the same way as the synthesis example 6, synthesis of monomer was performed using 25.3 grams (0.23 mols) of sodium butyrate salt in place of sodium acetate salt. As a result, there was obtained 32 grams of propylcarbonyloxyethoxyethyl methacrylate. The yield was 89%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 0.98–1.2 (t, 3 H), 1.5–1.95 (t, 3 H), 1.945–1.95 (s, 3 H), 2.06–2.08 (s, 3 H), 3.82–3.85 (t, 2 H), 4.2–4.28 (t, 2 H), 5.64–5.67 (s, 1 H), 6.02–6.07 (m, 1 H), 6.12–6.18 (s, 1 H)

[SYNTHESIS EXAMPLE 11]

Synthesis of Adamantyloxyethoxyethyl Methacrylate represented with the formula [16]

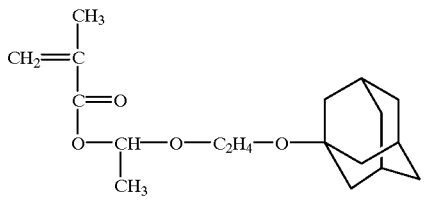

[16]

In the same way as the synthesis example 6, synthesis of monomer was performed using 40.3 grams (0.23 mols) of sodium 1-damantylalcohol salt in place of sodium acetate salt. As a result, there was obtained 41.7 grams of adamantyloxyethoxyethyl methacrylate. The yield was 90%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.05–2.2 (m, 21 H), 3.82–3.85 (t, 2 H), 4.2–4.28 (t, 2 H), 5.64–5.67 (s, 1 H), 6.02–6.07 (m, 1 H), 6.12–6.18 (s, 1 H)

[SYNTHESIS EXAMPLE 12]

Synthesis of Adamantylcarbonyloxyethoxyethyl Methacrylate represented with the formula [17]

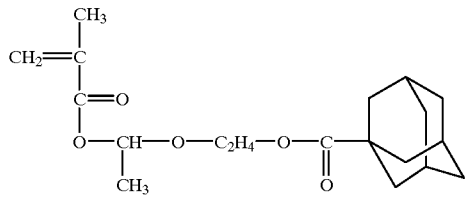

[17]

In the same way as the synthesis example 6, synthesis of monomer was performed using 46.7 grams (0.23 mols) of sodium 1-damantylcarboxylic acid salt in place of sodium acetate salt. As a result, there was obtained 46.5 grams of adamantylcarbonyloxyethoxyethyl methacrylate. The yield was 92%.

IR (liquid film method) (cm$^{-1}$): 2950, 2880 ($v_{C-H}$), 1720 ($v_{C=O}$), 1640 ($v_{C=C}$), 1170 ($v_{C-O}$)

$^1$H-NMR (CDCl$_3$, internal standard material: tetramethylsilane) ppm: 1.05–2.2 (m, 22 H), 3.82–3.85 (t, 2 H), 4.2–4.28 (t, 2 H), 5.64–5.67 (w, 1 H), 6.02–6.07 (m, 1 H), 6.12–6.18 (w, 1 H)

[EMBODIMENT 1]

Synthesis of Poly (tricyclodecylacrylate-ethoxyethyl methacrylate-methacrylic acid) represented with the formula [18] (Composition Ratio=5:3:2)

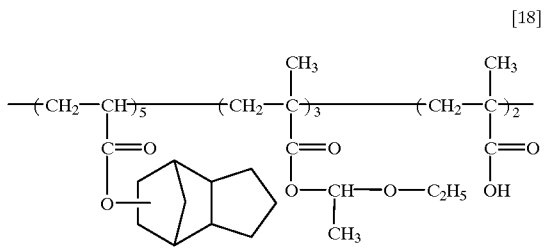

[18]

Following (a) to (c) were disclosed in 80 grams of dry tetrahydrofuran under argon (Ar) gas atmosphere within a 300-ml egg plant shaped flask having a three way type plug.

(a) 21.7 grams (0.105 mols) of tricyclodecylacrylate commercially available from Hitachi Kasei Co. Ltd. under the tradename "FA-513A".

(b) 10 grams (0.063 mols) of ethoxyethyl methacrylate which is a compound having been obtained in the synthesis example 1.

(c) 3.63 grams (0.042 mols) of methacrylic acid.

The composition ratio among the materials (a) to (c) was 5:3:2. Then, 30 ml solution of tetrahydrofuran in which 1.5 grams (0.00915 mols) of azobisisobutyronitrile, which is one of polymerization initiators, was dissolved was added to the mixture of (a) to (c). Then, the resultant mixture was heated at 60–65° C. for an hour. Then, reprecipitation was repeated twice by introducing the resultant solution into 1 liter of ligroin. Precipitated polymer was collected by filtering, and dried at 2 mmHg at 40° C. for 24 hours under reduced pressure. As a result, there was obtained 20.2 grams of poly(tricyclodecylacrylate-ethoxyethylmethacrylate-methacrylic acid) in the form of white powder. The yield was 57%. The copolymerization ratio obtained by $^1$H-NMR measurement was almost the same as the composition ratio among the above listed materials (a) to (c). The polystyrene equivalent weight-average molecular weight was 29,600, and the degree of dispersion was 2.17.

IR (KBr briquette method) (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 2]

Synthesis of Poly (tricyclodecylacrylate-buthoxyethyl methacrylate-methacrylic acid) represented with the formula [19] (Composition Ratio=5:3:2)

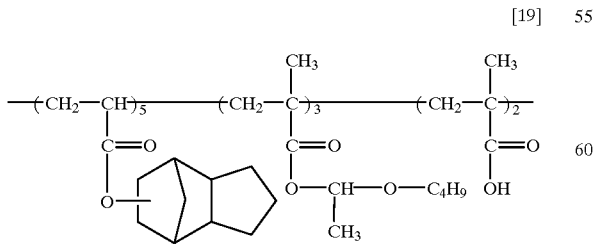

[19]

In the same way as the embodiment 1, synthesis of terpolymer was performed using 11.7 grams (0.0632 mols) of buthoxyethyl methacrylate, which is a compound having been obtained in the synthesis example 2, in place of ethoxyethyl methacrylate. As a result, there was obtained 20.5 grams of poly (tricyclodecylacrylate-buthoxyethyl methacrylate-methacrylic acid) in the form of white powder. The yield was 55%.

Weight-Average Molecular Weight (polystyrene equivalent molecular weight)=27,600, Degree of Dispersion=2.29

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 3]

Synthesis of Poly (tricyclodecylacrylate-octyloxyethyl methacrylate-methacrylic acid) represented with the formula [20] (Composition Ratio=5:3:2)

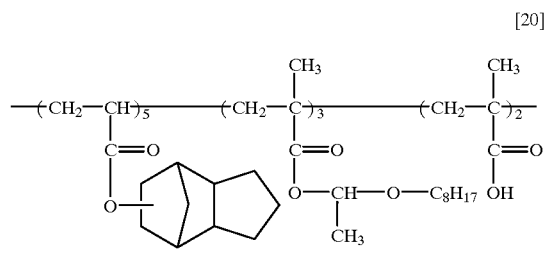

[20]

In the same way as the embodiment 1, synthesis of terpolymer was performed using 16.8 grams (0.0632 mols) of octyloxyethyl methacrylate, which is a compound having been obtained in the synthesis example 3, in place of ethoxyethyl methacrylate. As a result, there was obtained 20 grams of poly (tricyclodecylacrylate-octyloxyethyl methacrylate-methacrylic acid) in the form of white powder. The yield was 48%.

Weight-Average Molecular Weight (polystyrene equivalent molecular weight)=27,600, Degree of Dispersion=2.44

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 4]

Synthesis of Poly (tricyclodecylacrylate-methoxypropyl methacrylate-methacrylic acid) represented with the formula [21] (Composition Ratio=5:3:2)

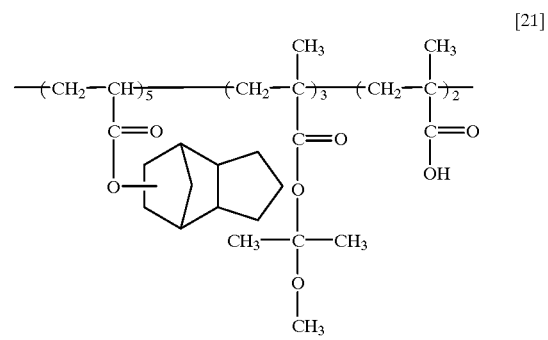

[21]

In the same way as the embodiment 1, synthesis of terpolymer was performed using 10 grams (0.0632 mols) of methoxypropyl methacrylate, which is a compound having been obtained in the synthesis example 4, in place of ethoxyethyl methacrylate. As a result, there was obtained 17.6 grams of poly (tricyclodecylacrylate-methoxypropyl methacrylate-methacrylic acid) in the form of white powder. The yield was 50%.

Weight-Average Molecular Weight (polystyrene equivalent molecular weight)=27,600, Degree of Dispersion=2.41

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 5]

Synthesis of Poly (tricyclodecylacrylate-methoxyethoxyethyl methacrylate-methacrylic acid) represented with the formula [22] (Composition Ratio=5:3:2)

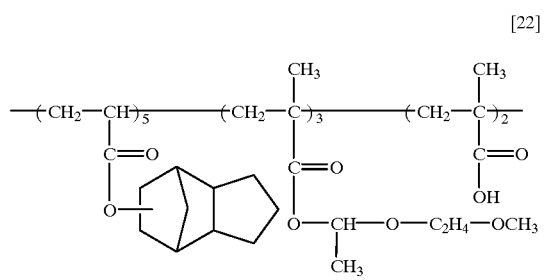

[22]

In the same way as the embodiment 1, synthesis of terpolymer was performed using 11.9 grams (0.0632 mols) of methoxyethoxyethyl methacrylate, which is a compound having been obtained in the synthesis example 5, in place of ethoxyethyl methacrylate. As a result, there was obtained 19.1 grams of poly (tricyclodecylacrylate-methoxyethoxyethyl methacrylate-methacrylic acid). The yield was 52%.

Weight-Average Molecular Weight (polystyrene equivalent molecular weight)=28,800, Degree of Dispersion=2.41

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 6]

Synthesis of Poly (tricyclodecylacrylate-cyclohexylethyl methacrylate-methacrylic acid) represented with the formula [23] (Composition Ratio=5:3:2)

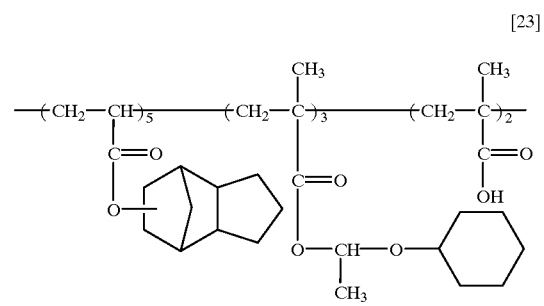

[23]

In the same way as the embodiment 1, synthesis of terpolymer was performed using 13.4 grams (0.0632 mols) of cyclohexylethyl methacrylate, which is a compound having been obtained in the synthesis example 6, in place of ethoxyethyl methacrylate. As a result, there was obtained 19.7 grams of poly (tricyclodecylacrylate-cyclohexylethyl methacrylate-methacrylic acid). The yield was 51%.

Weight-Average Molecular Weight (polystyrene equivalent molecular weight)=26,600, Degree of Dispersion=2.2

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 7]

Synthesis of Poly (tricyclodecylacrylate-acetoxyethoxyethyl methacrylate-methacrylic acid) represented with the formula [24] (Composition Ratio=5:3:2)

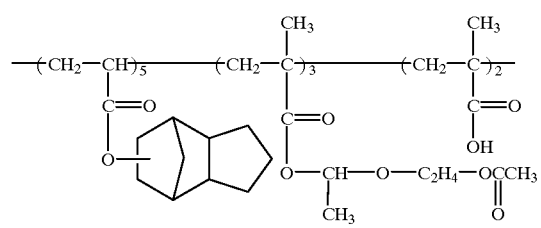

[24]

In the same way as the embodiment 1, synthesis of terpolymer was performed using 14 grams (0.0632 mols) of acetoxyethoxyethyl methacrylate, which is a compound having been obtained in the synthesis example 7, in place of ethoxyethyl methacrylate. As a result, there was obtained 20 grams of poly (tricyclodecylacrylate-acetoxyethoxyethyl methacrylate-methacrylic acid). The yield was 51%.

Weight-Average Molecular Weight (polystyrene equivalent molecular weight)=21,000, Degree of Dispersion=2.25

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 8]

Synthesis of Poly (tricyclodecylacrylate-ethoxyethoxyethyl methacrylate-methacrylic acid) represented with the formula [25] (Composition Ratio=5:3:2)

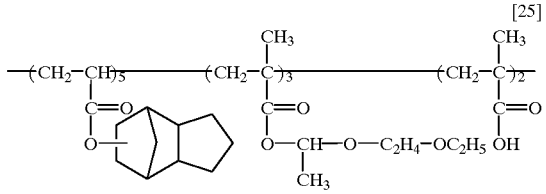

[25]

In the same way as the embodiment 1, synthesis of terpolymer was performed using 14.5 grams (0.0632 mols) of ethoxyethoxyethyl methacrylate, which is a compound having been obtained in the synthesis example 8, in place of ethoxyethyl methacrylate. As a result, there was obtained 19.1 grams of poly (tricyclodecylacrylate-ethoxyethoxyethyl methacrylate-methacrylic acid). The yield was 51%.

Weight-Average Molecular Weight (polystyrene equivalent molecular weight)=26,600, Degree of Dispersion=2.2

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 9]

Synthesis of Poly (tricyclodecylacrylate-buthoxyethoxyethyl methacrylate-methacrylic acid) represented with the formula [26] (Composition Ratio=5:3:2)

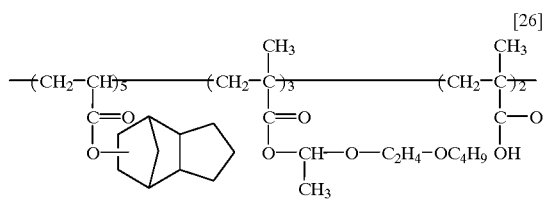

[26]

In the same way as the embodiment 1, synthesis of terpolymer was performed using 19.3 grams (0.0636 mols) of buthoxyethoxyethyl methacrylate, which is a compound having been obtained in the synthesis example 9, in place of ethoxyethyl methacrylate. As a result, there was obtained 21.9 grams of poly (tricyclodecylacrylate-buthoxyethoxyethyl methacrylate-methacrylic acid). The yield was 55%.

Weight-Average Molecular Weight (polystyrene equivalent molecular weight)=26,600, Degree of Dispersion=2.2

IR (cm$^{-1}$): 2400–3500 ($v_{O-H}$) 2950, 2880 ($v_{C-H}$), 1722 ($v_{C=O}$), 1660 ($v_{C=O}$), 1170 ($v_{C-O}$)

[EMBODIMENT 10]

Synthesis of Poly (tricyclodecylacrylate-propylcarbonyloxyethoxyethyl methacrylate-methacrylic acid) represented with the formula [27] (Composition Ratio=4:4:2)

In the same way as the embodiment 1, synthesis of terpolymer was performed using 3.4 grams (0.0166 mols) of tricyclodecanylacrylate, 0.7 grams (0.0083 mols) of methacrylic acid, and 4 grams (0.0166 mols) of propylcarbonyloxyethoxyethyl methacrylate, which is a compound having been obtained in the synthesis example 10, in place of ethoxyethyl methacrylate. As a result, there was obtained 4.86 grams of poly (tricyclodecylacrylate-propylcarbonyloxyethoxyethyl methacrylate-methacrylic acid). The yield was 60%.

Weight-Average Molecular Weight (polystyrene equivalent molecular weight)=27,600, Degree of Dispersion=2.29

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 11]

Synthesis of Poly (tricyclodecylacrylate-adamantyloxyethoxyethyl methacrylate-methacrylic acid) represented with the formula [28] (Composition Ratio=4:4:2)

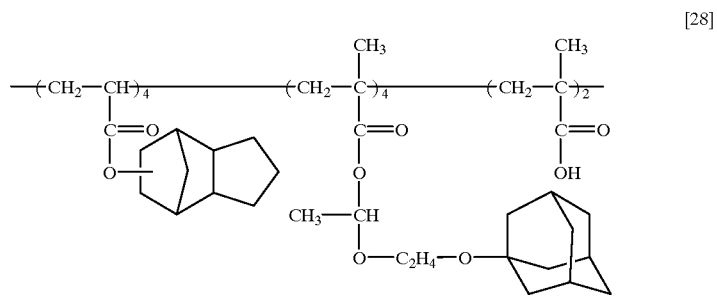

[28]

In the same way as the embodiment 1, synthesis of terpolymer was performed using 3.4 grams (0.0166 mols) of tricyclodecanylacrylate, 0.7 grams (0.0083 mols) of methacrylic acid, and 5 grams (0.0166 mols) of adamantyloxyethoxyethyl methacrylate, which is a compound having been obtained in the synthesis example 7, in place of ethoxyethyl methacrylate. As a result, there was obtained 5.4 grams of poly (tricyclodecylacrylate-adamantyloxyethoxyethyl methacrylate-methacrylic acid). The yield was 60%.

Weight-Average Molecular Weight (polystyrene equivalent molecular weight)=29,500, Degree of Dispersion=2.35

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 12]

Synthesis of Poly (tricyclodecylacrylate-adamantylcarbonyloxyethoxy methacrylate-methacrylic acid) represented with the formula [29] (Composition Ratio=5:3:2)

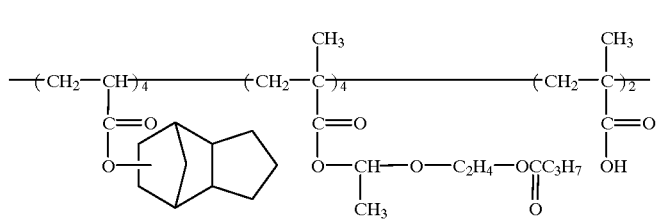

[27]

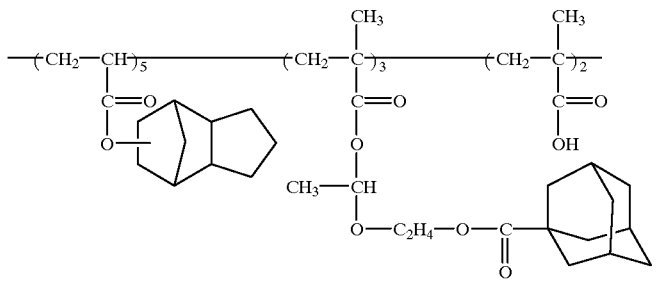

[29]

In the same way as the embodiment 1, synthesis of terpolymer was performed using 19.3 grams (0.0636 mols) of adamantylcarbonyloxyethoxyethyl methacrylate, which is a compound having been obtained in the synthesis example 8, in place of ethoxyethyl methacrylate. As a result, there was obtained 24 grams of poly (tricyclodecylacrylate-adamantylcarbonyloxyethoxyethyl methacrylate-methacrylic acid). The yield was 55%.

Weight-Average Molecular Weight (polystyrene equivalent molecular weight)=26,600, Degree of Dispersion=2.2

IR (cm$^{-1}$): 2400–3500 ($v_{O-H}$), 2950, 2880 ($v_{C-H}$), 1722 ($v_{C=O}$), 1660 ($v_{C=O}$), 1170 ($v_{C-O}$)

[EMBODIMENT 13]

Thermal decomposition points were measured by means of a differential thermal decomposition apparatus with respect to the polymers obtained in the embodiments 1 to 12 and the polymer obtained in the synthesis example 1, which is protected with a tetrahydropyranyl group. The results were shown in Table 1. Herein, the thermal decomposition point (referred to simply as "TDP" in Table 1) is defined as a temperature at which a weight of a polymer is decreased by 5%.

TABLE 1

| Polymer | TDP |
|---|---|
| Polymer of Embodiment 1 | 158° C. |
| Polymer of Embodiment 2 | 160° C. |
| Polymer of Embodiment 3 | 171° C. |
| Polymer of Embodiment 4 | 144° C. |
| Polymer of Embodiment 5 | 174° C. |
| Polymer of Embodiment 6 | 139° C. |
| Polymer of Embodiment 7 | 173° C. |
| Polymer of Embodiment 8 | 174° C. |
| Polymer of Embodiment 9 | 172° C. |
| Polymer of Embodiment 10 | 178° C. |
| Polymer of Embodiment 11 | 196° C. |
| Polymer of Embodiment 12 | 205° C. |
| Polymer of Reference Example 1 | 134° C. |

[EMBODIMENT 14]

There was prepared a resist composed of the following materials A, B and C. The experiment mentioned hereinbelow was conducted under a yellow lamp.

(A) 0.99 grams of poly (tricyclodecanylacrylate-ethoxyethyl methacrylate-methacrylic acid), which is the polymer having been synthesized in the embodiment 1. The copolymerization ratio was 5:3:2.

(B) 0.01 gram of N-hydroxysuccinimidetoluenesulfonate (photo acid generator)

(C) 4.000 grams of propyleneglycolmonomethylether acetate (solvent)

Figure 2:
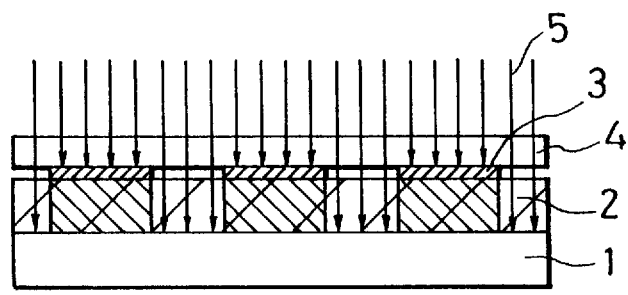
Figure 3:
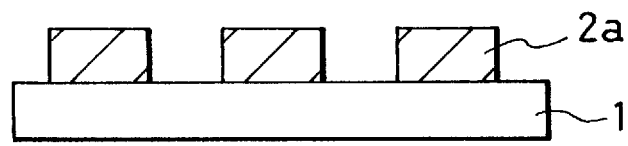
Figure 4:
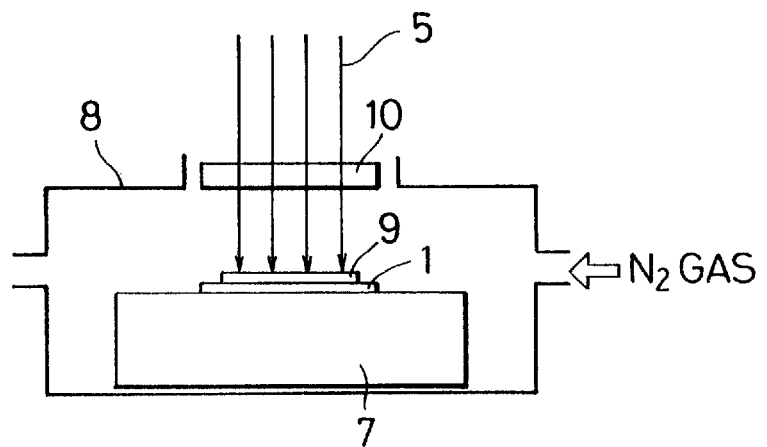
FIG. 4 is a schematic view illustrating an experimental device for exposing a resist to a light.

The mixture composed of the above mentioned materials A, B and C was filtrated with a 0.2 μm teflon filter to thereby prepare a resist. The thus prepared resist was applied on a 3-inch thickness silicon wafer 1 by spin coating process, and then heated at 90° C. for 60 seconds on a hot plate. Thus, there was formed a thin resist layer 2 having a thickness of 0.5 μm on the wafer 1, as illustrated in FIG. 1. Then, as illustrated in FIG. 4, the wafer 1 on which the thin layer 2 was formed was placed on an X–Y stage 7 in a light-radiating apparatus 8 sufficiently purged with nitrogen. On the resist layer 2 was closely placed a mask 9 comprising a quartz plate 4 on which a pattern 3 composed of chrome was formed, and then ArF excimer laser beam 5 was irradiated to the resist layer 2 through a homogenizer 10 and further through the mask 9, as illustrated in FIGS. 2 and 4. Shortly after that, the wafer 1 was baked on a hot plate at 90° C. for 60 seconds, and then was developed by dipping in an alkaline developing reagent for 60 seconds. The alkaline developing reagent is an aqueous solution containing tetramethylammoniumhydroxide by 0.048%, and was maintained at 23° C. Subsequently, the wafer 1 was rinsed in pure water for 60 seconds. As a result, only exposed regions of the resist layer 2 was dissolved and thus removed in the developing reagent, thereby there was obtained a positive type pattern 2a, as illustrated in FIG. 3.

In this experiment, 0.20 μm line and space (L/S) resolution was obtained when the exposure energy was approximately 30 mJ/cm$^2$. The pattern 2a was resolved and observed with a scanning electron microscope (SEM) commercially available from Hitachi Co. Ltd,. under the tradename of SE-4100 with the result that undeveloped regions and peel-off of the pattern were not observed.

[EMBODIMENTS 15–25]

In the same way as the embodiment 14, the same experiment was conducted using the polymers obtained in the embodiments 2–12 in place of the polymer obtained in the embodiment 1. In the embodiments 20 and 21, post-exposure heat treatment was carried out at 100° C. for 60 seconds. The resolution of the patterns and the associated exposure dose (referred to simply as "ED" in Table 2) are shown in Table 2. The pattern was resolved and observed with SEM with the result that undeveloped regions and peel-off of the pattern were not observed.

TABLE 2

| Polymer | | Resolution [μmL/S] | ED [mJ/cm$^2$] |
|---|---|---|---|
| Embodiment 15 | Polymer of Embodiment 2 | 0.2 | 30 |
| Embodiment 16 | Polymer of Embodiment 3 | 0.22 | 31 |
| Embodiment 17 | Polymer of Embodiment 4 | 0.22 | 25 |
| Embodiment 18 | Polymer of Embodiment 5 | 0.22 | 28 |
| Embodiment 19 | Polymer of Embodiment 6 | 0.25 | 25 |
| Embodiment 20 | Polymer of Embodiment 7 | 0.20 | 33 |
| Embodiment 21 | Polymer of Embodiment 8 | 0.20 | 35 |
| Embodiment 22 | Polymer of Embodiment 9 | 0.22 | 40 |
| Embodiment 23 | Polymer of Embodiment 10 | 0.25 | 33 |
| Embodiment 24 | Polymer of Embodiment 11 | 0.25 | 50 |
| Embodiment 25 | Polymer of Embodiment 12 | 0.25 | 32 |

[REFERENCE EXAMPLE 1]

Synthesis of poly (tricyclodecanylacrylate-tetrahydropyranyl methacrylate-methacrylic acid) represented with the general formula [30]

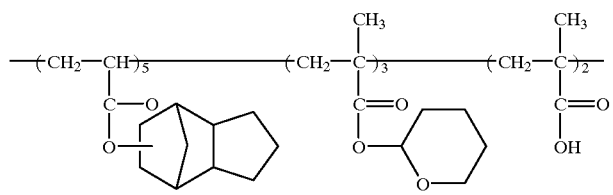

[30]

Followings (a) to (c) were dissolved in 80 grams of dry tetrahydrofuran under argon (Ar) gas atmosphere within a 300-ml egg plant shaped flask having a three way type plug.

(a) 14 grams (0.068 mols) of tricyclodecanylacrylate.
(b) 6.8 grams (0.04 mols) of tetrahydropyranyl methacrylate, which was synthesized by a conventional method such as G. N. Taylor, Chemistry Material, Vol. 3 (6), 1991, pp. 1031–1040.
(c) 2.32 grams (0.027 mols) of methacrylic acid.

The composition ratio among the materials (a) to (c) was 5:3:2. Then, 30 ml solution of tetrahydrofuran in which 1.55 grams (0.00915 mols) of azobisisobutyronitrile, which is one of polymerization initiators, was dissolved was added to the mixture of (a) to (c). Then, the resultant mixture was heated at 60–70° C. for an hour. Then, reprecipitation was repeated twice by introducing the resultant solution into 1 liter of hexane. Precipitated polymer was collected by filtering, and dried at 2 mmHg at 40° C. for 24 hours under reduced pressure. As a result, there was obtained 14.0 grams of poly(tricyclodecanylacrylate-tetrahydropyranyl methacrylate-methacrylic acid) in the form of white powder. The yield was 60%. The copolymerization ratio obtained by $^1$H-NMR measurement was almost the same as the composition ratio among the above listed materials (a) to (c). The polystyrene equivalent weight-average molecular weight was 28,000, and the degree of dispersion was 2.28.

[REFERENCE EXAMPLE 2]

Synthesis of Poly (tricyclodecanylacrylate-tert-butyl methacrylate-methacrylic acid) represented with the formula [31]

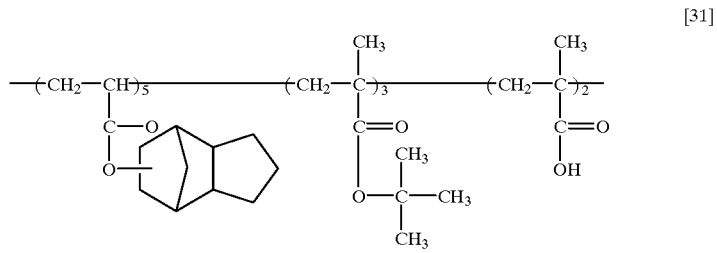

[31]

In the same way as the reference example 1, synthesis of poly (tricyclodecanylacrylate-tert-butyl methacrylate-methacrylic acid) was performed using 5.8 grams (0.04 mols) of tert-butyl methacrylate in place of tetrahydro methacrylate. As a result, there was obtained 13.9 grams of poly (tricyclodecanylacrylate-tert-butyl methacrylate-methacrylic acid) in the form of white powder. The copolymerization ratio was 5:3:2. The yield was 63%. The weight-average molecular weight was 28,000, and the degree of dispersion was 2.28.

[REFERENCE EXAMPLE 3]

There was prepared a resist composed of the following materials A, B and C. The experiment mentioned hereinbelow was conducted under a yellow lamp.

(A) 0.99 grams of the polymer synthesized in the reference example 1.

(B) 0.01 gram of N-hydroxysuccinimidetoluenesulfonate (photo acid generator)

(C) 4.000 grams of propyleneglycolmonomethylether acetate (solvent)

The mixture composed of the above mentioned materials A, B and C was filtrated with a 0.2 μm teflon filter to thereby prepare a resist. The thus prepared resist was applied on a 3-inch thickness silicon substrate by spin coating process, and then baked at 90° C. for 60 seconds on a hot plate. Thus, there was formed a thin resist layer having a thickness of 0.7 μm on the substrate. Then, the substrate on which the thin layer was formed was placed in a light-radiating apparatus sufficiently purged with nitrogen. On the resist layer was closely placed a mask comprising a quartz plate on which a pattern composed of chrome was formed, and then ArF excimer laser beam was irradiated to the resist layer through the mask. Shortly after that, the substrate was baked on a hot plate at 90° C. for 60 seconds, and then was developed by dipping in an alkaline developing reagent for 60 seconds. The alkaline developing reagent is an aqueous solution containing tetramethylammoniumhydroxide by 0.048 weight percent, and was maintained at 23° C. Subsequently, the wafer 1 was rinsed in pure water for 60 seconds. As a result, only exposed regions of the resist layer was dissolved and thus removed in the developing reagent, thereby there was obtained a positive type pattern.

In this experiment, 0.25 μm line and space (L/S) resolution was obtained when the exposure energy was approximately 47.3 mJ/cm². However, there was observed resist residue or unremoved resist portion.

[REFERENCE EXAMPLE 4]

There was prepared a resist composed of the following materials A, B and C. The experiment mentioned hereinbelow was conducted under a yellow lamp.

(A) 0.99 grams of the polymer synthesized in the reference example 2

(B) 0.01 gram of N-hydroxysuccinimidetoluenesulfonate (photo acid generator)

(C) 4.000 grams of propyleneglycolmonomethylether acetate (solvent)

The mixture composed of the above mentioned materials A, B and C was filtrated with a 0.2 μm teflon filter to thereby prepare a resist. The thus prepared resist was applied on a 3-inch thickness silicon wafer by spin coating process, and then baked at 80° C. for 60 seconds on a hot plate. Thus, there was formed a thin resist layer having a thickness of 0.7 μm on the wafer. Then, the wafer on which the thin layer was formed was placed in a light-radiating apparatus sufficiently purged with nitrogen. On the resist layer was closely placed a mask comprising a quartz plate on which a pattern composed of chrome was formed, and then ArF excimer laser beam was irradiated to the resist layer through the mask. Shortly after that, the substrate was baked on a hot plate at 110° C. for 60 seconds, and then was developed by dipping in an alkaline developing reagent for 60 seconds. The alkaline developing reagent is an aqueous solution containing tetramethylammoniumhydroxide by 2.3 weight percent, and was maintained at 23° C. Subsequently, the wafer 1 was rinsed in pure water for 30 seconds. As a result, a fine resist pattern was not formed.

As having been described in connection with the preferred embodiments, the polymer made in accordance with the present invention is thermally stable, and has a high efficiency of decomposition by acid. Hence, the photoresist containing the polymer can have high resolution, and accordingly provides a fine pattern without production of scum.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A photo resist comprising: a resin composed of a polymer represented with the following general formula (1); and a photo acid generator which produces acid when exposed to a light, said resin has a weight percent in the range of 75 to 99.8 both inclusive, and said photo acid generator has a weight percent in the range of 0.2 to 25 both inclusive:

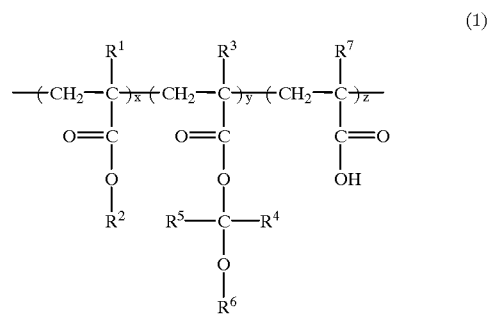

(1)

wherein each of $R^1$, $R^3$, and $R^7$ represents one of a hydrogen atom and a methyl group, $R^2$ represents a hydrocarbon group, $R^4$ represents one of a hydrogen atom and a hydrocarbon group having a carbon number of 1 or 2, $R^5$ represents a hydrocarbon group having a carbon number of 1 or 2, $R^6$ represents one of (a) a hydrocarbon group having a carbon number in the range of 1 to 12, (b) a hydrocarbon group having a carbon number in the range of 1 to 12 and replaced with an alkoxy group having a carbon number in the range of 1 to 12, and (c) a hydrocarbon group having a carbon number in the range of 1 to 12 and replaced with an acyl group having a carbon number in the range of 1 to 13, x+y+z=1, x is in the range of 0.1 to 0.9, y is in the range of 0.1 to 0.7, and z is in the range of 0 to 0.7.

2. The photoresist as set forth in claim 1, wherein said polymer has a weight average molecular weight in the range of 1,000 to 1,000,000.

3. The photoresist as set forth in claim 1, wherein said resin has a weight percent in the range of 85 to 99.5, and said photo acid generator has a weight percent in the range of 0.5 to 15.

4. The photoresist as set forth in claim 1, wherein said photo acid generator is one represented by the following general formula (3):

(3)

wherein each of $R^7$ and $R^8$ represents one of straight-chain, branch-type and cyclic alkyl groups, and $R^9$ represents one of (a) a straight-chain, branch-type or cyclic alkyl group, (b) a 2-oxo cyclic alkyl group, (c) a 2-oxo straight chain alkyl group, an (d) a 2-oxo branch-type alkyl group, and $Y^-$ represents a negative ion.

5. The photoresist as set forth in claim 1, wherein said photo acid generator is one represented with the following general formula (4):

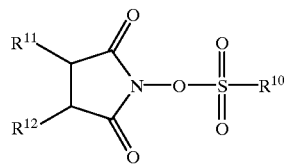
(4)

wherein $R^{10}$ represents one of (a) straight-chain, branch-type or cyclic alkyl group, (b) a replaced aromatic ring, and (c) a non-replaced aromatic ring, and each of $R^{11}$ and $R^{12}$ represents one of (a) a straight-chain, branch-type or cyclic alkyl group and (b) a straight-chain, branch-type or cyclic haloalkyl group.

6. A photo resist as in claim 1 wherein $R^2$ is a bridged cyclic hydrocarbon group and having a carbon number in the range of 7 to 13.

* * * * *